US006727550B2

(12) United States Patent
Tezuka et al.

(10) Patent No.: US 6,727,550 B2
(45) Date of Patent: Apr. 27, 2004

(54) INTEGRATED CIRCUIT DEVICE

(75) Inventors: Tsutomu Tezuka, Yokohama (JP);
Takashi Kawakubo, Yokohama (JP);
Naoharu Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/188,824

(22) Filed: Jul. 5, 2002

(65) Prior Publication Data
US 2003/0006461 A1 Jan. 9, 2003

(30) Foreign Application Priority Data
Jul. 6, 2001 (JP) ........................................ 2001-205945

(51) Int. Cl.$^7$ ............................................. H01L 27/01
(52) U.S. Cl. ........................ 257/347; 257/349; 257/351; 257/353; 257/354; 257/616; 257/18
(58) Field of Search ................................ 257/347, 349, 257/351, 353, 354, 616, 18–20

(56) References Cited

U.S. PATENT DOCUMENTS

| 5,583,059 A | * | 12/1996 | Burghartz | ...................... | 437/31 |
| 5,891,769 A | * | 4/1999 | Liaw et al. | .................. | 438/167 |
| 5,998,807 A | * | 12/1999 | Lustig et al. | .................. | 257/66 |
| 6,369,438 B1 | | 4/2002 | Sugiyama et al. | | |
| 6,410,371 B1 | * | 6/2002 | Yu et al. | ....................... | 438/151 |

FOREIGN PATENT DOCUMENTS

JP 09321307 A * 12/1997

OTHER PUBLICATIONS

A.R. Powell et al., "New Approach to the Growth of Low Dislocation relaxed SiGe Material" *Applied Physics Letters*, vol. 64, (14), pp. 1856–1858, Apr. 1994.

K. Brunner et al., "Molecular Beam Epitaxy Growth and Thermal Stability of $Si_{1-x}Ge_x$ Layers on Extremely Thin Silicon–on–Insulator Substrates", *Thin Solid Films*, vol. 321, pp. 245–250, May 1998.

T. Tezuka et al., "A Novel Fabrication Technique of Ultra–Thin and Relaxed SiGe Buffer Layers with High Ge Content for Sub–100 nm Strained Silicon–on–Insulator MOSFETs", *Extended Abstracts of the 2000 International Conference on Solid State Devices and Materials*, pp. 472–473, Aug. 2000.

T. Mizuno et al., "High Performance Strained–Si p–MOS-FETs on SiGe–on–Insulator Substrates", *IEDM Tech. Dig.*, pp. 934–936, 1999.

Naoharu Sugiyama et al., U.S. patent application Ser. No. 09/955,144, filed Sep. 19, 2001, "Semiconductor Device and Method of Producing the Same".

Tsutomu Tezuka et al., U.S. patent application Ser. No. 10/029,022, filed Dec. 28, 2001, "Semiconductor Device and Method of Manufacturing the Same".

* cited by examiner

*Primary Examiner*—Nathan J. Flynn
*Assistant Examiner*—Remmon R. Fordé
(74) *Attorney, Agent, or Firm*—Finnegan, Henderson, Farabow, Garrett & Dunner, L.L.P.

(57) ABSTRACT

An integrated circuit device comprises an insulation layer formed on a substrate, a plurality of lattice relaxed SiGe layers each formed in an island form on the insulation layer, wherein a maximum size of the island form thereof is 10 μm or less, one of a strained Si layer, a strained SiGe layer and a strained Ge layer formed on at least one of the plurality of lattice relaxed SiGe layers, and a field effect transistor having a gate electrode and source and drain regions, wherein the gate electrode is formed on one of the strained Si layer, the strained SiGe layer and the strained Ge layer with a gate insulation film is disposed therebetween, and the source and drain regions is formed to sandwich a channel region formed below the gate electrode with the gate insulation film disposed therebetween.

10 Claims, 7 Drawing Sheets

Oxidation without island-shaped processing
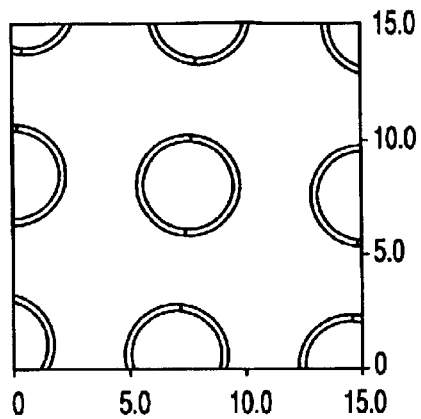
Oxidation after island-shaped processing
F I G. 5B
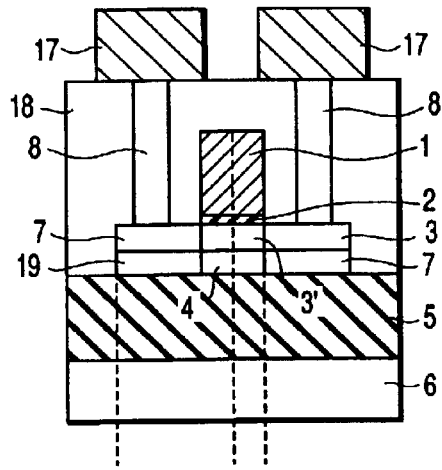
F I G. 6A
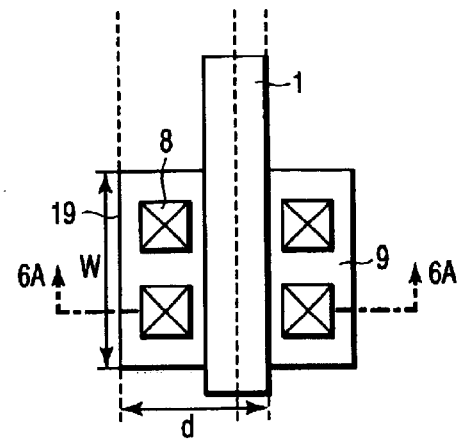
F I G. 6B

INTEGRATED CIRCUIT DEVICE

CROSS-REFERENCE TO RELATED APPLICATIONS

This application is based upon and claims the benefit of priority from the prior Japanese Patent Application No. 2001-205945, filed Jul. 6, 2001, the entire contents of which are incorporated herein by reference.

BACKGROUND OF THE INVENTION

1. Field of the Invention

This invention relates to an integrated circuit device and more particularly to an integrated circuit device including field effect transistors.

2. Description of the Related Art

An attempt has been made to enhance the operation speed, improve the functions and lower the power consumption of large-scale integrated circuits (LSI) such as microprocessors. In order to successfully achieve the above attempt, it is necessary to make transistors small while the driving abilities of the respective transistors configuring the circuit are maintained or enhanced. In order to meet the above requirement of miniaturization, the gate length is reduced in the conventional MOSFET, for example.

However, recently, a technical or economical barrier to a reduction in the gate length rapidly becomes higher. Therefore, as a method for enhancing the operation speed of the LSI, a method of using a channel material with high mobility is known other than the method for reducing the gate length.

As the channel material with high mobility, much attention is paid to strained Si and strained SiGe. The method for forming strained Si or strained SiGe is as follows. Strained Si is formed by forming Si on lattice relaxed SiGe having a larger lattice constant than Si by epitaxial growth. Strained SiGe is formed by forming strained SiGe on lattice relaxed SiGe or Si having a lower composition ratio than strained SiGe by epitaxial growth. The mobility of electrons and holes in strained Si is increased by in-plane tensile strain and the mobility of holes in strained SiGe is increased by in-plane compressive strain. Further, since the amount of strain caused in the channel layer becomes larger as a difference in the Ge composition ratio between the underlying lattice relaxed SiGe layer and the channel material is larger, that is, a difference in the lattice constant therebetween is larger, the mobility becomes higher.

The inventor of this application and others have proposed a MOSFET (strained SOI-MOSFET) having an SOI (Si-on-insulator) structure combined with strained Si and relaxed SiGe and demonstrated the operation thereof (see T. Mizuno, S. Takagi, N. Sugiyama, J. Koga, T. Tezuka, K. Usuda, T. Hatakeyama, A. Kurobe, and A. Toriumi, IEDM Technical Digests p. 934 (1999), the entire contents of which are incorporated herein by reference).

FIG. 1 is a cross sectional view showing a strained SOI-MOSFET using strained Si.

As shown in FIG. 1, the strained SOI-MOSFET includes an Si substrate 6, an insulation layer 5 formed on the Si substrate 6, a lattice relaxed $Si_{0.9}Ge_{0.1}$ buffer layer 4 formed on the insulation layer 5, a strained Si layer 3 formed on the lattice relaxed $Si_{0.9}Ge_{0.1}$ buffer layer 4, a gate oxide layer 2 formed on the strained Si layer 3, and a gate electrode 1 formed on the gate oxide layer 2. A portion of the strained Si layer 3 which lies under the gate oxide layer 2 functions as a channel region. Source/drain regions 7 are formed on both sides of the channel region. The strained Si layer 3 may be replaced by a strained SiGe layer.

The strained SOI-MOSFET with the above structure has an advantage that the carrier mobility is high since the strained Si layer 3 is used as the channel. Further, in addition to the above advantage, it has advantages that the junction capacitance can be made small by use of the SOI structure and the MOSFET can be made small with the impurity concentration kept low. Since holes generated by impact ionization can be easily absorbed into the source region through the relaxed SiGe layer, occurrence of the body floating effect which is normally treated as a problem in the SOI structure can be suppressed.

The inventor of this application and others have found that it is necessary to substantially completely lattice-relax the lattice relaxed $Si_{1-x}Ge_x$ buffer layer 4 with lower dislocation density and make the thickness thereof to 30 nm or less in order to put the strained SOI-MOSFET having the above advantages into practice. The mobility of the strained Si layer 3 (or strained SiGe layer) can be further enhanced by forming the strained Si layer 3 on the lattice relaxed $Si_{1-x}Ge_x$ buffer layer 4 which satisfies the above condition by epitaxial growth.

The inventor of this application and others have found a method for forming the lattice relaxed $Si_{1-x}Ge_x$ buffer layer on the insulation layer 5, 4 which includes growth of an $Si_{1-x}Ge_x$ layer (x=0.1) having a low Ge composition ratio and successive thermal oxidation of the $Si_{1-x}Ge_x$ layer (x=0.1) at high temperatures. The method has the following property. As the thermal oxidation process proceeds, Ge in the $Si_{1-x}Ge_x$ layer (x=0.1) is enriched to form an $Si_{1-x}Ge_x$ layer (x>0.5) having a higher Ge composition ratio. At the same time, the $Si_{1-x}Ge_x$ layer (x>0.5) is lattice-relaxed and made thin (see T. Tezuka, N. Sugiyama, T. Mizuno, H. Suzuki and S. Takagi, Extended Abstracts of the 20001 International Conference on Solid State Devices and Materials (Sendai, 2000) p. 472, the entire contents of which are incorporated herein by reference).

The method for forming the lattice relaxed SiGe layer will be explained with reference to FIGS. 2A to 2E.

First, as shown in FIG. 2A, an $Si_{1-x}Ge_x$ layer (x=0.1) 11 having a low Ge composition ratio is formed by epitaxial growth on an Si substrate 6. Then, an insulation layer 5 is formed between the Si substrate 6 and the $Si_{1-x}Ge_x$ layer (x=0.1) 11 by use of an SIMOX method.

Next, a dry oxidation process is performed at a high temperature of 1200° C. Then, as shown in FIG. 2B, Ge is removed from an Si oxide layer 12 which is formed on the surface of the structure and Ge is accumulated into an SiGe layer 18 which lies under the Si oxide layer 12. Thus, the $Si_{1-x}Ge_x$ layer (x>0.5) 18 having a high Ge composition ratio is formed. By the above heat treatment, the $Si_{1-x}Ge_x$ layer (x>0.5) 18 is lattice-relaxed by a slip on the interface with the underlying insulation layer 5.

Next, as shown in FIG. 2C, the Si oxide layer 12 on the lattice relaxed $Si_{1-x}Ge_x$ layer (x>0.5) 18 is removed by use of an ammonium fluoride solution. Then, a strained Si layer 3 (or strained SiGe layer) is formed by epitaxial growth on the lattice relaxed $Si_{1-x}Ge_x$ layer (x>0.5) 18.

Subsequently, as shown in FIG. 2D, an element is separated by mesa-etching.

Next, as shown in FIG. 2E, a gate insulation layer 2, a gate electrode 1 and source/drain regions 7 are formed according to the process for forming an SOI-MOSFET and thus a strained SOI-MOSFET is formed.

The $Si_{1-x}Ge_x$ layer (x=0.1) 11 having the low Ge composition ratio and formed on the insulation layer 5 is thermally oxidized at high temperatures in the step shown in FIG. 2B. Therefore, Ge atoms are removed from the SiGe oxide layer 11 formed on the surface of the structure and accumulated in the underlying SiGe layer 18. The insulation layer 5 which lies under the SiGe layer 18 prevents Ge atoms from diffusing into the Si substrate 6. As a result, the Ge composition ratio of the SiGe layer 18 is increased as the oxidation process proceeds.

Since the lattice constant of SiGe increases as the Ge composition ratio becomes higher, shearing stress occurs on the interface between the insulation layer 5 and the SiGe layer 18. If a sufficient amount of slip on the interface or plastic deformation of the insulation layer 5 occurs, the SiGe layer can freely expand and contract due to the shearing stress so that lattice relaxation proceeds without dislocation generation.

However, particularly, when the insulation layer 5 is formed of $SiO_2$, plastic deformation or slip between the SiGe layer 18 and the insulation layer 5 will not sufficiently occur even if the heat treatment is performed at a temperature which is as high as 1200° C. Therefore, the SiGe layer 18 is lattice-relaxed in a mode of dislocation generation. If the temperature is further raised, $SiO_2$ is softened and a slip between the SiGe layer 18 and the insulation layer 5 or plastic deformation of the insulation layer 5 tends to occur. However, if the temperature becomes excessively high, the SiGe layer 18 will be melted.

As described above, it is difficult to reduce the threading dislocation density without melting the SiGe layer 18 to a value of $10^4$ cm$^{-2}$ which is a practical target.

BRIEF SUMMARY OF THE INVENTION

An object of this invention is to provide an integrated circuit device in which the reliability is high, the operation speed is high and the power consumption is low.

An integrated circuit device according to an aspect of the present invention comprises: a substrate; an insulation layer formed on the substrate; a plurality of lattice relaxed SiGe layers each formed in an island form on the insulation layer, wherein a maximum size of the island form of each of the lattice relaxed SiGe layers is not longer than 10 μm; one of a strained Si layer, a strained SiGe layer and a strained Ge layer formed on at least one of the plurality of lattice relaxed SiGe layers; and a field effect transistor having a gate electrode and source and drain regions, wherein the gate electrode is formed on one of the strained Si layer, the strained SiGe layer and the strained Ge layer with a gate insulation film are disposed therebetween, and the source and drain regions are formed to sandwich a channel region formed below the gate electrode with the gate insulation film disposed therebetween.

In above aspect, the following manners are preferable. The following manners may be applied solely or by combining appropriately.

(1) A Ge composition ratio of the strained SiGe layer is not less than 50 atomic %.

(2) A distance between the island-form regions is at least 0.1 μm.

An integrated circuit device according to another aspect of the present invention comprises: a substrate; an insulation layer formed on the substrate; a lattice relaxed SiGe layer formed on the insulation layer, wherein the lattice relaxed SiGe layer having slits or holes is formed within a distance of 10 μm from the end portion thereof and a distance between the slits or holes is set not longer than 10 μm; one of a strained Si layer, a strained SiGe layer and a strained Ge layer formed on the lattice relaxed SiGe layer; and a field effect transistor having a gate electrode and source and drain regions, wherein the gate electrode is formed on one of the strained Si layer, the strained SiGe layer and the strained Ge layer with a gate insulation film disposed therebetween, the source and drain regions are formed to sandwich a channel region formed below the gate electrode with the gate insulation film disposed therebetween.

In above aspect, the following manners are preferable. The following manners may be applied solely or by combining appropriately.

(1) A Ge composition ratio of the strained SiGe layer is not less than 50 atomic %.

(2) A width of the slit is at least 0.1 μm.

(3) The hole is formed in a long narrow shape along the gate electrode. With this configuration, a width of the hole is at least 0.1 μm.

In the above aspect, C (carbon) may be contained in the strained Si layer and strained SiGe layer or relaxed SiGe layer.

BRIEF DESCRIPTION OF THE SEVERAL VIEWS OF THE DRAWINGS

FIGS. 5A and 5B are diagrams based on an interatomic force microphotograph of the surface obtained after oxidation when island formation is not performed before oxidation and when island formation is performed, respectively;

FIGS. 6A and 6B are a cross sectional view and top view of a field effect transistor contained in an integrated circuit device according to an aspect of this invention;

DETAILED DESCRIPTION OF THE INVENTION

Figure 1:
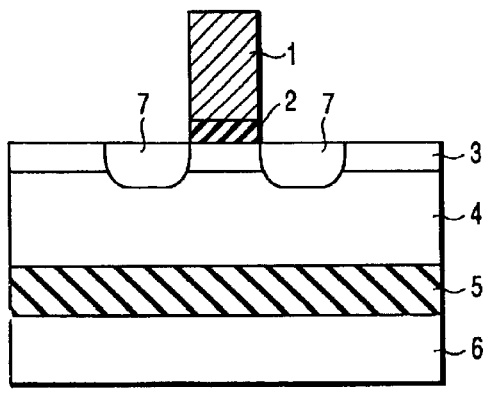
FIG. 1 is a cross sectional view of the conventional field effect transistor.
Figure 2A:
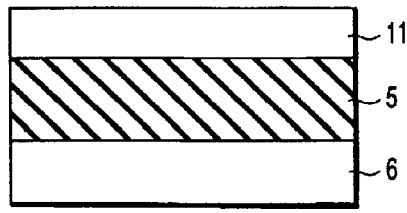
FIGS. 2A to 2E are cross sectional views for illustrating the respective main steps of a method for manufacturing the conventional field effect transistor.
Figure 2B:
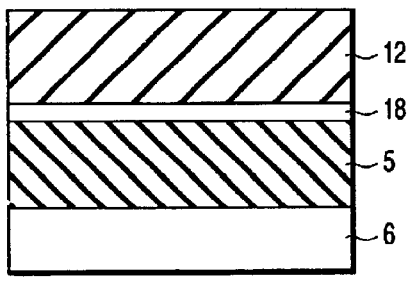
Figure 2C:
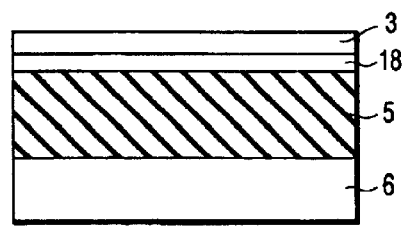
Figure 2D:
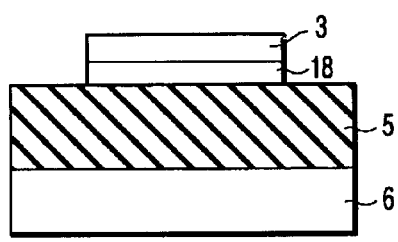
Figure 2E:
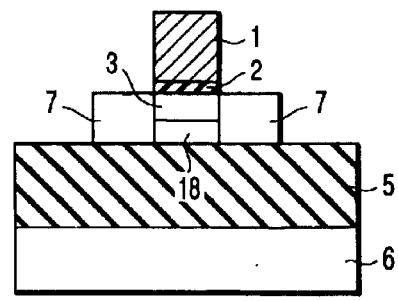
Figure 3A:
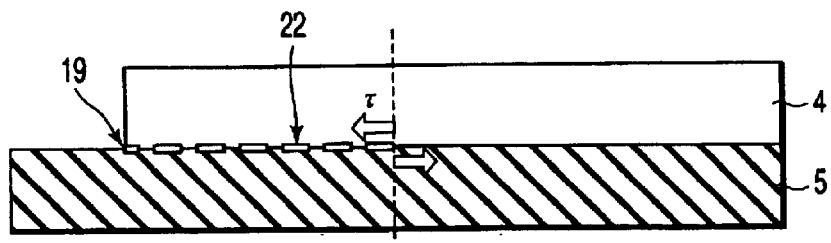
FIGS. 3A and 3B are a cross sectional view of a lattice relaxed SiGe layer according to an embodiment of this invention and a diagram for explaining stress in the lattice relaxed SiGe layer.
Figure 3B:
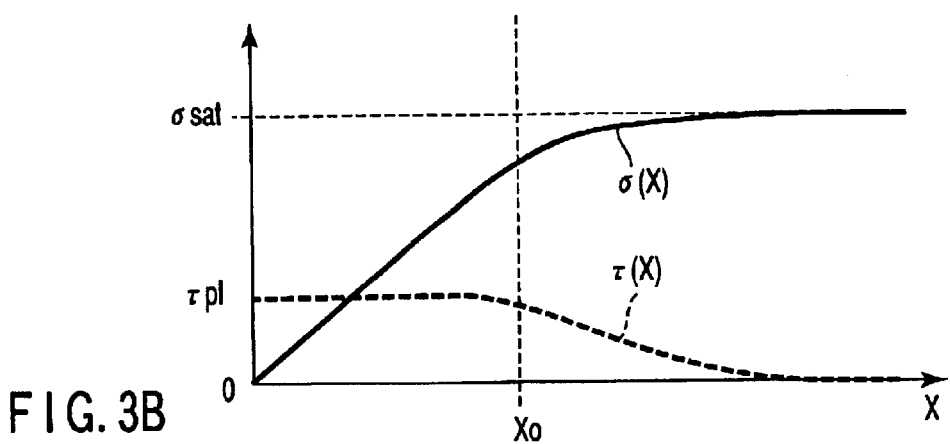

FIGS. 3A and 3B are a cross sectional view of a lattice relaxed SiGe layer which is applied to an integrated circuit device according to an embodiment of this invention and a diagram for explaining stress in the lattice relaxed SiGe layer. In FIGS. 3A and 3B, the influence given by oxide layers formed on the upper portion and side surfaces of a SiGe layer 4 is assumed to be neglected. Since it is known that stress is not accumulated on a flat SiO$_2$/Si interface on which oxidation proceeds, the above assumption is considered adequate. Further, it is assumed that lattice displacement occurs only in an X direction in FIGS. 3A and 3B. In addition, it is assumed that no dislocation occurs in the internal portion of the SiGe layer 4.

If the Ge composition ratio of the SiGe layer 4 increases, the lattice constant becomes larger. As a result, stress occurs in the internal portion of the SiGe layer 4. At this time, shearing stress $\tau(x)$ in the interface between the insulation layer 5 and the SiGe layer 4 varies in the layer as shown by broken lines in FIG. 3B. As shown by the broken lines in FIG. 3B, shearing stress in a portion near the end portion 19 of the SiGe layer 4 (that is, a slip plane 22 which is a periphery of the contact surface between the SiGe layer 4 and the insulation layer 5) becomes approximately constant at a value of shearing stress (share flow stress) which is caused when a slip starts to occur on the interface between the SiGe layer 4 and the insulation layer 5. When the slip terminates in a position which is inwardly separated from (in a direction apart from) the end portion 19 by $X_0$, the shearing stress $\tau(x)$ gradually decreases and becomes zero.

The axial stress $\sigma(x)$ in the SiGe layer 4 can be obtained by integrating the shearing stress $\tau(x)$ by a distance X from the end portion 19. Therefore, the axial stress $\sigma(x)$ gradually becomes larger with an increase in the distance from the end portion 19 and reaches a saturated value $\sigma$sat in the internal portion (in position sufficiently separated from the end portion 19) of the SiGe layer 4. That is, the SiGe layer 4 is completely lattice-relaxed in a portion near the end portion 19 and the degree of relaxation is more reduced in a portion which is separated from the end portion 19 (in position sufficiently separated from the end portion 19) and closer to the internal portion. If the saturated value $\sigma$sat corresponds to the internal stress of the SiGe layer 4 when the lattice relaxation is not made at all, that is, when the lattice constant is kept unchanged before and after oxidation.

By taking the above fact into consideration, the embodiment of this invention is made to have the feature that the thermal oxidation is performed in a condition that the SiGe layer is previously formed into a plurality of islands, for example, on the insulation layer. That is, it has the feature that the thermal oxidation is performed in a condition that the end portion is formed around the SiGe layer. In this case, the end portion indicates a boundary portion between a layer in which the SiGe layer is continuously formed and a layer in which the SiGe layer is not formed. By making the above structure, it becomes possible to cause the slip on the interface between the SiGe layer and the underlying insulation layer with the end portion of the SiGe layer set as an origin and release the stress as the Ge composition ratio is increased by thermal oxidation.

The inventor of this application and others made the following experiment to check the distance $X_0$ of a portion in which a slip occurred. First, an Si$_{0.9}$Ge$_{0.1}$ layer 4 with a thickness of 116 nm was formed by epitaxial growth on an SOI substrate 5 with a thickness of 30 nm. Then, the photolithography process and the succeeding chemical dry-etching process were sequentially performed to form the SiGe layer 4 into a circular pattern of island form with the radius R.

Subsequently, the dry oxidation process at 1200° C. was performed until the thickness of the SiGe layer 4 became 77 nm. At this time, the Ge composition ratio of the SiGe layer 4 increased to 15 atomic %. Next, the dependency of internal strain on the radius R was measured based on Raman spectroscopy for a circular pattern of the SiGe layer 4. The measuring position is set at substantially the center of the circular pattern and the laser spot diameter is approximately 1 $\mu$m.

Figure 4:
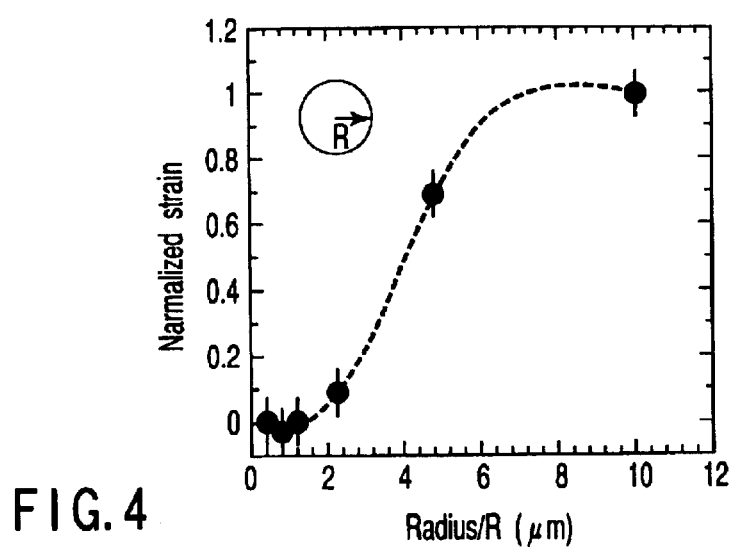
FIG. 4 is a graph showing the dependency of internal strain on the radius R based on Raman spectroscopy for circular islands of SiGe layers.

FIG. 4 shows the result of the measurement.

In FIG. 4, the ordinate indicates the lattice strain factor normalized by use of the lattice constant of lattice relaxed SiGe having the Ge composition ratio of 15 atomic % after oxidation and the amount thereof is proportional to $\sigma$ shown in FIG. 3B. The abscissa indicates the distance from the end portion 19.

It is understood from FIG. 4 that the internal strain in a region lying within the distance of 5 $\mu$m from the end portion 19 of the SiGe layer 4 is rapidly decreased. That is, it is understood that a slip occurs between the SiGe layer 4 and the underlying insulation layer 5 in the region lying within the distance of 5 $\mu$m from the end portion 19 so that the SiGe layer 4 can be lattice-relaxed. It is also understood that the lattice relaxation is caused in the above region not by the dislocation mode but by the complete slip and the threading dislocation density is equal to or lower than $10^4$ cm$^{-2}$. Particularly, it is understood that complete lattice relaxation can be attained in a region lying within the distance of 2 $\mu$m from the end portion 19.

From the above results, it is understood that, in the lattice relaxed SiGe layer 4 on the region lying within the distance of 5 $\mu$m from the end portion 19 of the lattice relaxed SiGe layer 4 which is formed in an island form, excellent crystallinity of the underlying SiGe substrate is obtained unlike the conventional case. As a result, an extremely flat layer with no dislocation can be attained as the strained Si layer (or strained SiGe layer) 3 formed on the lattice relaxed SiGe layer 4. Therefore, it is only required to form a field effect transistor in which a channel or an active region of the element, that is, a region sandwiched between the source and drain regions exists on the strained Si layer (or strained SiGe layer) 3 which is formed on the surface lying within the distance of 5 $\mu$m from the peripheral portion of the contact surface of the lattice relaxed SiGe layer 4 with the insulation layer 5. More preferably, a field effect transistor may be formed on a region lying within the distance of 2 $\mu$m from the end portion 19. This is because the normalized strain in the SiGe layer 4 is 0.1 or less in the region lying within the distance of 2 $\mu$m from the end portion 19 as it is understood from FIG. 4, and the threading dislocation density is lowered since it is substantially completely lattice-relaxed.

Further, it is preferable that the Ge composition ratio of the lattice relaxed SiGe layer 4 should not be lower than 10 atomic % and not higher than 50 atomic %. If the Ge composition ratio is lower than 10 atomic %, the lattice constant cannot be made sufficiently large and a sufficient amount of strain cannot be attained. If the Ge composition ratio exceeds 50 atomic %, the high reliability cannot be attained, for example, in processing temperatures in the process. More preferably, the Ge composition ratio is not lower than 15 atomic % and not higher than 35 atomic %. Further, as described before, the Ge composition ratio of the strained SiGe layer 3 formed on the lattice relaxed SiGe layer 4 is higher than that of the lattice relaxed SiGe layer 4. That is, the Ge composition ratio of the strained SiGe layer 3 is preferably higher than 35 atomic % and, more preferably, higher than 50 atomic %.

Figure 5A:
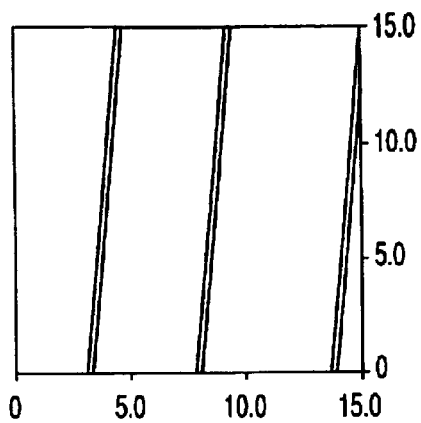

FIGS. 5A and 5B show results obtained by observing a case wherein the lattice relaxed SiGe layer is formed without island formation as in the conventional case and a case wherein the lattice relaxed SiGe layer is formed by performing island formation as in the embodiment of this invention by use of atomic force microscope images. If the oxidation is performed without island formation and the lattice relaxed SiGe layer is formed on the entire surface of the wafer as in the conventional case, an undulation pattern called a cross hatch is formed on the surface and stripe-form convex portions (or concave portions) as shown in FIG. 5A will be observed. This is because the increase of the volume caused by increase of the lattice constant of the lattice relaxed SiGe layer cannot be absorbed by the slip at the boundary surface between the SiGe layer and the insulation layer.

If the lattice relaxed SiGe layer is formed in a circular pattern (truncated cone form) as shown in FIG. 5B, a flat surface can be obtained in a region which lies within the distance of 5 μm from the end portion of the pattern. This is because the degree of stress accumulated in the SiGe layer 4 is low due to the slip occurring on the interface in the insulation layer 5.

Further, an etching process using a mixed acid including hydrofluoric acid, nitric acid and acetic acid was performed and the etch pit was evaluated. However, in this invention, completely no etch pit was observed within the observed area of 1 μm².

According to the results of the above experiments, it is understood that relaxation occurs without dislocation and cross hatch in a region which lies within the distance of approximately 5 μm from the end portion 19 of the lattice relaxed SiGe layer 4 formed in an island form.

In the embodiment of this invention, as described above, the strained Si layer (or strained SiGe layer) 3 with a thickness which is smaller than the critical thickness is formed on the lattice relaxed SiGe layer 4 formed in an island form, for example. In this case, the crystallinity of the SiGe substrate which lies under the strained Si layer (or strained SiGe layer) 3 formed on the region lying within the distance of 5 μm from the end portion 19 of the lattice relaxed SiGe layer 4 (that is, the periphery of the contact surface of the lattice relaxed SiGe layer 4 which is formed in contact with the insulation layer 5) is excellent unlike the conventional case. As a result, the strained Si layer (or strained SiGe layer) 3 which is extremely flat and has no dislocation can be attained. Particularly, a strained Si layer (or strained SiGe layer) 3 which is formed on a region lying within the distance of 2 μm from the end portion 19 of the lattice relaxed SiGe layer 4 (that is, the periphery of the contact surface of the lattice relaxed SiGe layer 4 which is formed in contact with the insulation layer 5) is formed as an ideal strained Si layer (or strained SiGe layer) 3 which is extremely flat and has no dislocation. According to the embodiment of this invention, there is provided an integrated circuit device in which a plurality of lattice relaxed SiGe layers each of which is the same as the lattice relaxed SiGe layer 4 formed in the island form as described above are arranged.

FIGS. 6A and 6B are a cross sectional view and top view of a field effect transistor which is so formed that a region sandwiched between the source and drain regions will exist on a region lying within the distance of 5 μm from the end portion 19 of the lattice relaxed SiGe layer 4 formed in one island region, for example. FIG. 6A is a cross sectional view taken along the 6A—6A line of FIG. 6B.

The field effect transistor shown in FIGS. 6A and 6B includes an Si substrate 6, an $SiO_2$ insulation layer 5, a lattice relaxed $Si_{0.7}Ge_{0.3}$ layer 4, a strained Si layer 3, a gate insulation layer 2, and a polysilicon gate electrode 1. The $SiO_2$ insulation layer 5 is formed on the Si substrate 6 and has a thickness of 200 nm. The lattice relaxed $Si_{0.7}Ge_{0.3}$ layer 4 is formed in an island form with a thickness of 20 nm on the insulation layer 5. The strained Si layer 3 is formed on the lattice relaxed $Si_{0.7}Ge_{0.3}$ layer 4 and has a thickness of 10 nm. The gate insulation layer 2 is formed on the strained Si layer 3 and has a thickness of 1.5 nm. The polysilicon gate electrode 1 is formed on the gate insulation layer 2 and has a thickness of 200 nm.

Source and drain regions 7 are separately formed on both sides of a portion lying under the gate insulation layer 2. The source and drain regions 7 are formed by diffusing impurity into the lattice relaxed $Si_{0.7}Ge_{0.3}$ layer 4 and the strained Si layer 3 formed thereon. The gate length is 100 nm and the gate width W is 1 μm. The field effect transistor is buried in an insulation layer 18 and the source and drain regions 7 are respectively connected to electrodes 17 via contact holes 8.

The distance d from the end portion of a strained Si layer 3' lying between the source and drain regions 7 shown in FIGS. 6A and 6B to the end portion 19 of the lattice relaxed SiGe layer 4 which is formed in the island form is 0.5 μm. Since the channel region formed under the gate insulation layer 2 of the field effect transistor is formed on a region lying within the distance of 5 μm from the end portion 19 of the lattice relaxed SiGe layer 4 which is formed in the island form, it exhibits an excellent characteristic. Further, the lattice relaxed SiGe layer 4 is completely lattice-relaxed and no dislocation is observed. The surface roughness Rms of the strained Si layer 3 is 0.11 nm.

Figures 7A, 7B:
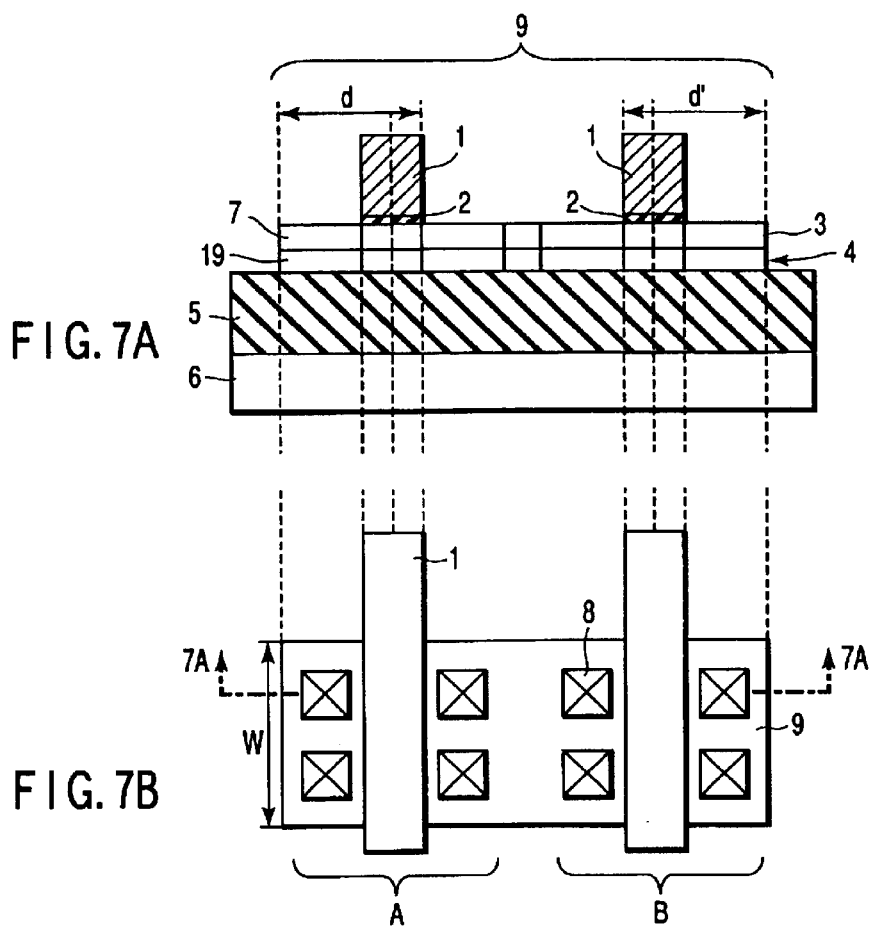
FIGS. 7A and 7B are a cross sectional view and top view of field effect transistors contained in an integrated circuit device according to an aspect of this invention.

FIGS. 7A and 7B are a cross sectional view and plan view showing two strained SOI-MOSFETs (which are respectively indicated by symbols A, B) with the gate lengths of 100 nm and 130 nm which are formed in one island form on the lattice relaxed SiGe layer 4. FIG. 7A is a cross sectional view taken along the 7A—7A line of FIG. 7B.

Each of the field effect transistors includes an Si substrate 6, an $SiO_2$ insulation layer 5, a lattice relaxed $Si_{0.7}Ge_{0.3}$ layer 4, a strained Si layer 3, a gate insulation layer 2, a polysilicon gate electrode 1 and source and drain regions 7. The $SiO_2$ insulation layer 5 is formed on the Si substrate 6 and has a thickness of 200 nm. The lattice relaxed $Si_{0.7}Ge_{0.3}$ layer 4 is formed in an island form with a thickness of 20 nm on the insulation layer 5. The strained Si layer 3 is formed on the lattice relaxed $Si_{0.7}Ge_{0.3}$ layer 4 and has a thickness of 10 nm. The gate insulation layer 2 is formed on the strained Si layer 3 and has a thickness of 1.5 nm. The polysilicon gate electrode 1 is formed on the gate insulation layer 2 and has a thickness of 200 nm. The source and drain regions 7 are separately formed in the strained Si layer 3.

The gate length of the field effect transistor indicated by the portion A shown in FIG. 7A is 100 nm. The gate length of the field effect transistor indicated by the portion B shown in FIG. 7B is 130 nm. The gate width W of each field effect transistor is 1 μm.

The distance d from the end portion of a strained Si layer 3' lying between the source and drain regions 7 of the transistor indicated by the portion A to the end portion of the lattice relaxed SiGe layer 4 which is formed in the island form is 0.5 μm. The distance d' from the end portion of the strained Si layer 3' lying between the source and drain regions 7 of the transistor indicated by the portion B to the end portion of the lattice relaxed SiGe layer 4 which is formed in the island form is 0.6 μm.

In a case where a plurality of field effect transistors are thus formed on the strained Si layer (or strained SiGe layer)

3 on one lattice relaxed SiGe layer 4, it is only required that the channel regions formed under the gate insulation layers 2 of the respective field effect transistors be formed on regions lying within the distance of 5 μm from the ends of the respective lattice relaxed SiGe layers 4.

FIGS. 8A to 8E are cross sectional views for illustrating the respective main steps of a method for manufacturing the field effect transistor explained with reference to FIGS. 6A to 7B.

Figure 8A:
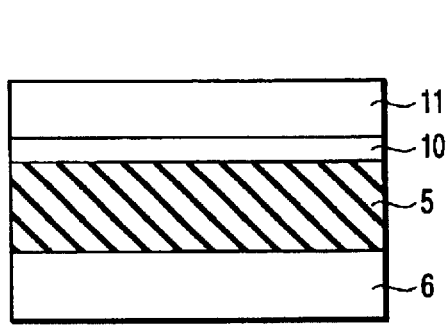
FIGS. 8A to 8E are cross sectional views for illustrating the respective main steps of a method for manufacturing a field effect transistor contained in an integrated circuit device according to an aspect of this invention.

First, as shown in FIG. 8A, an SOI substrate having a multilayer structure of the Si substrate 6, the insulation layer 5 and the Si layer 10 is prepared. The SOI substrate may be formed by an SOIX method or wafer bonding method. When taking the flatness of the interface between the Si layer 10 and the insulation layer 5 into consideration, it is preferable that the SOI substrate be formed by use of the laminating method. The thickness of the SOI layer 10 is reduced to 30 nm by the thermal oxidation process. Next, the oxide layer is removed by use of an ammonium fluoride solution.

Subsequently, a $Si_{0.9}Ge_{0.1}$ layer 11 with a thickness of 60 nm is grown on the Si layer 10 at growth temperatures of 500° C. to 650° C. by an UHV (Ultra-High Vacuum)-CVD (Chemical Vapor Deposition) process or LP (Low Pressure)-CVD process.

Figure 8B:
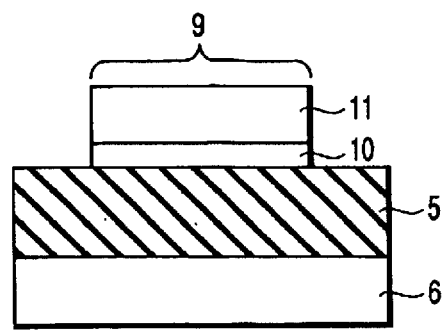

Then, as shown in FIG. 8B, a resist pattern is formed on the active area by the photolithography technology and the SiGe layer 11 is shaped into an island 9 of 1 μm square, for example, with the resist pattern used as a mask. At this time, the etching process such as a CDE (Chemical Dry Etching) process or RIE (Reactive Ion Etching) process may be used.

Figure 8C:
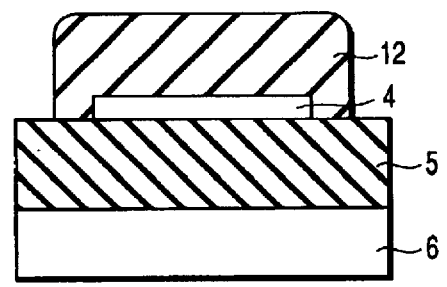

Next, as shown in FIG. 8C, a dry oxidation process is performed at 1200° C. to oxide the SiGe layer 4 until the thickness thereof reaches 20 nm. At this time, the Ge composition ratio of the SiGe layer 4 is increased to 0.3 and is substantially completely lattice-relaxed. In this case, a silicon oxide layer 12 formed by the thermal oxidation process is formed around the SiGe layer 4.

Figure 8D:
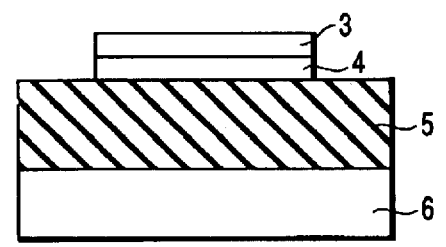

Subsequently, as shown in FIG. 8D, the silicon oxide layer 12 is removed by use of an ammonium fluoride solution or by the CDE process. Then, a strained Si layer 3 with the thickness of 10 nm is grown on the lattice relaxed SiGe layer 4 at the growth temperatures of 500° C. to 650° C. by the UHV-CVD or LP-CVD process. At this time, the strained Si layer 3 is selectively grown on the lattice relaxed SiGe layer 4.

Figure 8E:
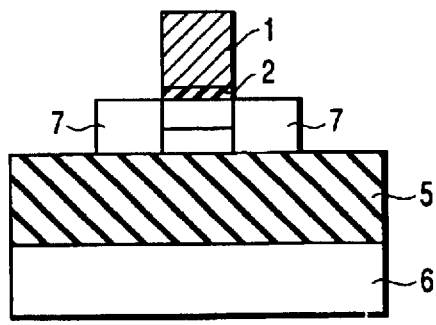

Next, as shown in FIG. 8E, a gate insulation layer 2 is formed and a gate electrode 1 is formed on the gate insulation layer by use of an SOI-CMOS process. Further, source and drain regions 7 are formed in the strained Si layer to form a strained SOI-MOSFET.

FIGS. 9A to 9D are cross sectional views for illustrating a modification of the process shown in FIGS. 8A to 8C.

With the method shown in FIGS. 9A to 9D, the flatness and the uniformity of the layer thickness and the composition of the SiGe layer 4 after oxidation can be improved by suppressing an influence given by roundabout oxidation (for example, an increase in the Ge composition ratio, reduction in the layer thickness, rising of the end portion of the SiGe layer 4) due to the presence of oxygen atoms which are diffused in the buried oxide layer 5 and reach the bottom surface of the SiGe layer 4.

Figure 9A:
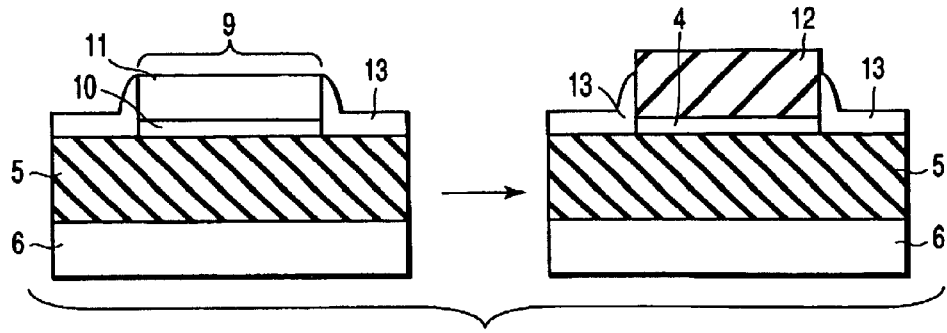
FIGS. 9A to 9D are cross sectional views for illustrating the respective main steps of a method for manufacturing a field effect transistor contained in an integrated circuit device according to an aspect of this invention.

In an example shown in FIG. 9A, an $Si_3N_4$ layer is formed as an anti-oxidation mask 13 around the element region 9 and on the insulation layer 5 before and after the thermal oxidation process. Since the $Si_3N_4$ layer is more difficult to be plastic-deformed than an $SiO_2$ layer, there occurs a possibility that relaxation of the SiGe layer will be prevented if a thick layer is used. On the other hand, if the $Si_3N_4$ layer is excessively thin, it cannot be used as a mask. Therefore, it is preferable that the thickness of the $Si_3N_4$ layer 13 be set within a range of 10 nm to 100 nm.

In FIG. 9A, an $SiO_2$ layer deposited by use of the CVD method may be used as the anti-oxidation mask 13. In this case, the layer cannot function as a mask if it does not have a certain thickness or more. Therefore, it is preferable that the thickness of the $SiO_2$ layer be 50 nm or more.

Figure 9B:
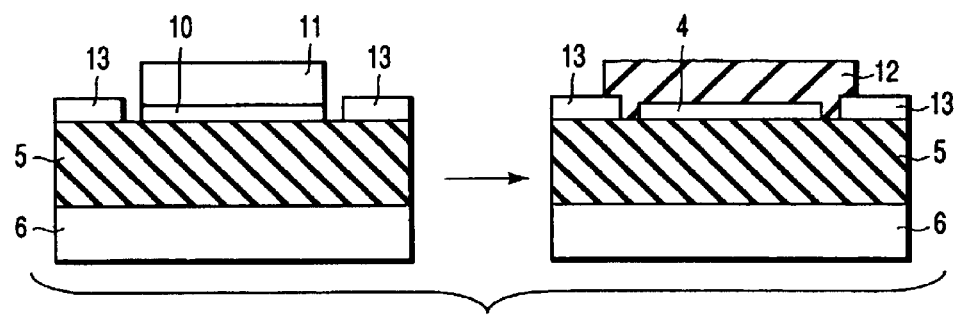

In an example shown in FIG. 9B, an $Si_3N_4$ layer is formed only on the insulation layer 5 and is not formed on the side surfaces of the element region 9. As a result, a small gap is formed between the element region 9 and the $Si_3N_4$ layer before the thermal oxidation process. Therefore, even if the $Si_3N_4$ layer 13 with sufficiently large thickness is formed, the SiGe layer 4 can spread in a lateral direction and it is possible to easily relax the SiGe layer 4.

Figure 9C:
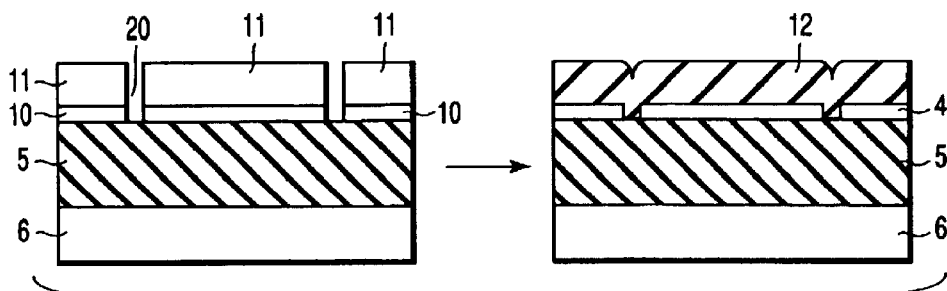

In FIG. 9C, an unwanted portion is not entirely removed, but grooves 20 are formed to form island regions. In this case, the width of the groove 20 is set to such a value that the SiGe layer 4 which is the island region will be lattice-relaxed and freely spread in the lateral direction. For example, if the Ge composition ratio of the island-form SiGe layer 4 is increased and finally set to 0.3 and the island-form SiGe layer 4 is relaxed, the lattice constant is increased by 1.25%. Therefore, when the sizes of adjacent regions are both 1 μm square, the width of the groove 13 is sufficient if it is 13 nm or more. In practice, the required widths of the grooves are different depending on the sizes of adjacent regions. As shown in FIG. 4, since no slip occurs on the interface in position at least 5 μm apart from the boundary region, a lateral deviation due to the lattice relaxation can be compensated for if the width of the groove is set to approximately 100 nm. Thus, the SiGe layer 4 and an unwanted portion of the oxide layer will function as a mask used for prevention of roundabout oxidation by separating the SiGe layer 4 into island regions by use of the grooves with the narrow width. In FIG. 9C, the groove is formed to reach the insulation layer 5, but a groove formed to an intermediate portion of the Si layer 10 or SiGe layer 11 can also be used.

Figure 9D:
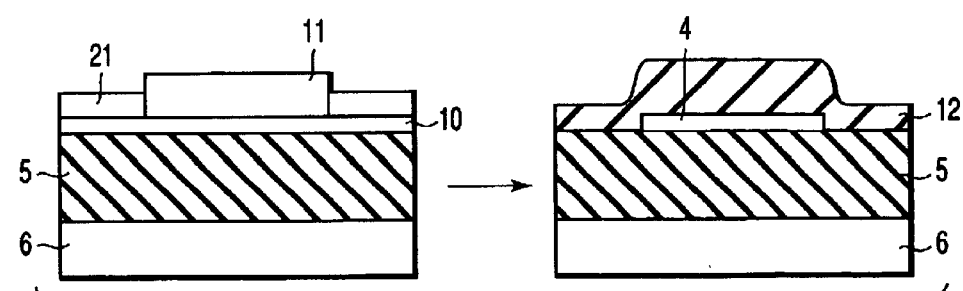

FIG. 9D shows an example in which an island region of the SiGe layer 11 is formed on the Si layer 10 by selective growth. In this case, as a selective growth mask 21, an oxide layer formed in the thinning process of the Si layer 10 is used after opening a window using a photolithography.

The number of steps in the manufacturing methods explained with reference to FIGS. 9A and 9B is increased in comparison with the manufacturing method explained with reference to FIGS. 8A to 8E. On the other hand, the manufacturing methods explained with reference to FIGS. 9C and 09D have an advantage that the number of steps therein is the same as that in the manufacturing method explained with reference to FIGS. 8A to 8E.

As described above, the integrated circuit device according to the present embodiment has a plurality of regions formed by dividing the Si layer 10 formed on the insulation layer 5 into an island form and setting the radius thereof to 5 μm or less (for example, in the case of a quadrangle, the length of one side is set to 10 μm or less). Therefore, the threading dislocation density of the lattice relaxed SiGe layer can be lowered and the strained Si layer (or strained SiGe layer) 3 formed on the lattice relaxed SiGe layer can be made free from dislocation and is excellent in flatness. As a result, the integrated circuit device according to the present embodiment can be formed with high reliability, high operation speed and low power consumption. Even in a case where the size of the island region is larger than 5 μm, this invention can be applied as follows. Application examples are shown in FIGS. 10 and 11.

Figure 10:
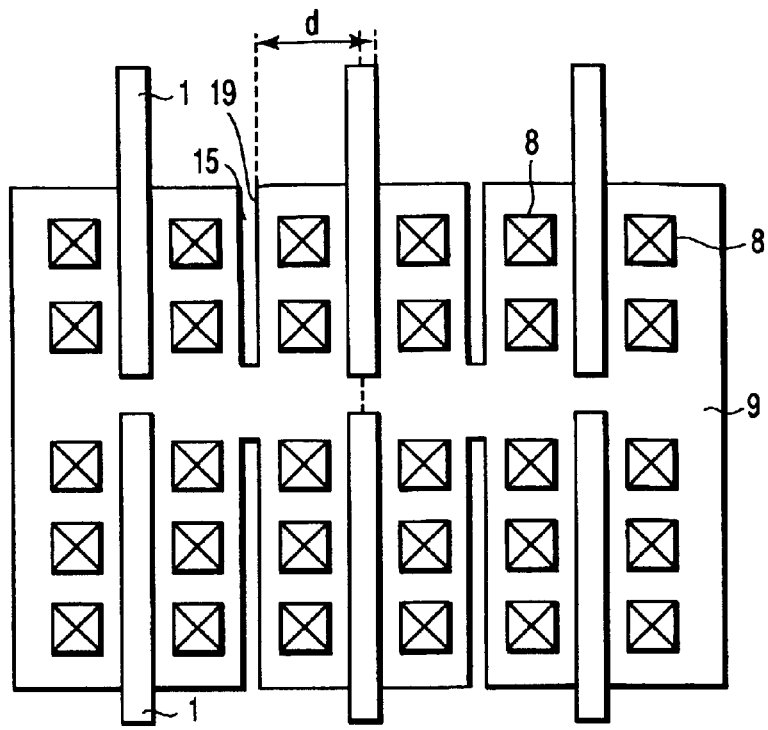
FIG. 10 is a top view showing another example of the structure of an integrated circuit device according to an aspect of this invention.
Figure 11:
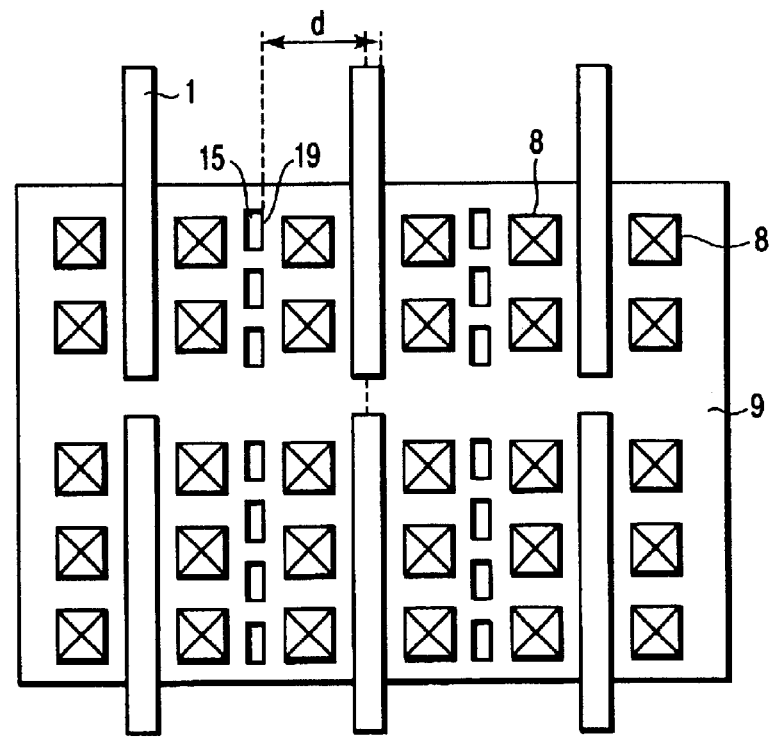
FIG. 11 is a top view showing still another example of the structure of an integrated circuit device according to an aspect of this invention.

FIG. 10 is a plan view showing a case wherein three or more MOSFETs exist on one island-form lattice relaxed SiGe layer and operate as one function block.

In FIG. 10, a transistor having small gate width of an upper gate electrode 1 is an n-channel transistor and a transistor having large gate width of a lower gate electrode is a p-channel transistor. The transistors configure a complementary MOS circuit.

In the example shown in FIG. 10, long narrow notches or slits 14 are formed in portions of an island-form lattice relaxed SiGe layer 9 which lie between the transistors formed on the lattice relaxed SiGe layer 9. For example, the width of the slit 14 is 0.15 µm and the maximum distance d from the end portion of the slit 14 to the end portion of a region sandwiched between source and drain regions (not shown) of the adjacent transistor is 5 µm. That is, the channel regions of all of the field effect transistors configuring the function block are each formed in a region within the distance of 5 µm from the end of a divided portion of the lattice relaxation SiGe layer 9 which is basically formed in an island form and has the slits 14.

FIG. 11 is a plan view showing a case wherein three or more MOSFETs exist on one island-form lattice relaxed SiGe layer and operate as one function block.

In FIG. 11, holes 15 are used instead of the slits. The width of the hole is 0.15 µm and the maximum distance d from the end portion of the hole to the end portion of a region sandwiched between source and drain regions (not shown) of the adjacent transistor is 5 µm. That is, the channel regions of all of the field effect transistors configuring the function block are each formed in a region within the distance of 5 µm from the end of a substantially divided portion of the lattice relaxation SiGe layer which is basically formed in an island form and has the holes.

In the above embodiment, various structures and materials can be applied to the gate electrode 1, the gate insulation layer 2 and the source and drain regions 7. For example, the gate electrode 1 may be formed of poly-SiGe, titanium-nitride, tungsten silicide or cobalt silicide. Further, the gate insulation layer 2 may be formed of one of or combination of dielectric materials such as $ZrO_2$, $Al_2O_3$, $HfO_2$, $Si_3N_4$, $TlO_2$. It is also possible to use the elevated source/drain structure or the like as the source and drain regions 7.

In addition, a strained Ge layer or strained $Si_{1-x}Ge_x$ (x>0.5) layer can be used instead of the strained Si layer. In this case, particularly, the lattice relaxed SiGe layer 4 whose Ge composition ratio is 0.3 or more, preferably, 0.5 or more is used. By using the above channel layers, particularly, the current drive of the p-channel transistor can be further enhanced. This is because the hole mobility in the strained SiGe layer with high Ge composition ratio is higher than that in the strained Si layer.

Further, a strained SiGeC channel can be used instead of the strained Si layer. In this case, the amount of strain and the energy of the valence band and conduction band can be independently controlled by controlling the composition ratio of C and Ge.

According to the present embodiment, an SiGe layer which is completely lattice-relaxed with the low dislocation density can be formed and a strained Si layer or strained SiGe layer having a large amount of strain can be formed on the SiGe layer. As a result, an integrated circuit device having high reliability, high operation speed and low power consumption can be attained.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An integrated circuit device comprising:
   a substrate;
   an insulation layer formed on said substrate;
   a plurality of lattice relaxed SiGe layers each formed in an island form on said insulation layer, a maximum size of the island form of each of said lattice relaxed SiGe layers being not longer than 10 µm;
   one of a strained SiGe layer and a strained Ge layer formed on at least one of said plurality of lattice relaxed SiGe layers; and
   a field effect transistor having a gate electrode and source and drain regions, the gate electrode formed on said strained SiGe layer and said strained Ge layer with a gate insulation film disposed therebetween, the source and drain regions formed to sandwich a channel region formed below the gate electrode with the gate insulation film disposed therebetween.

2. The integrated circuit device according to claim 1, wherein a Ge composition ratio of said strained SiGe layer is not less than 50 atomic %.

3. The integrated circuit device according to claim 1, wherein a distance between the island-form regions is at least 0.1 µm.

4. The integrated circuit device according to claim 1, wherein one of said strained Si layer and said strained SiGe layer contains carbon.

5. An integrated circuit device comprising:
   a substrate;
   an insulation layer formed on said substrate;
   a lattice relaxed SiGe layer formed on said insulation layer, said lattice relaxed SiGe layer having slits or holes formed within a distance of 10 µm from the end portion thereof and a distance between the slits or holes being set not longer than 10 µm;
   one of a strained Si layer, a strained SiGe layer and a strained Ge layer formed on said lattice relaxed SiGe layer; and
   a field effect transistor having a gate electrode and source and drain regions, the gate electrode formed on one of said strained Si layer, said strained SiGe layer and said strained Ge layer with a gate insulation film disposed therebetween, the source and drain regions formed to sandwich a channel region formed below the gate electrode with the gate insulation film disposed therebetween.

6. The integrated circuit device according to claim 5, wherein a Ge composition ratio of said strained SiGe layer is not less than 50 atomic %.

7. The integrated circuit device according to claim 5, wherein a width of the slit is at least 0.1 µm.

8. The integrated circuit device according to claim 5, wherein the hole is formed in a long narrow shape along the gate electrode.

9. The integrated circuit device according to claim 8, wherein a width of the hole is at least 0.1 µm.

10. The integrated circuit device according to claim 5, wherein one of the strained Si layer and the strained SiGe layer contains carbon.

* * * * *

UNITED STATES PATENT AND TRADEMARK OFFICE
CERTIFICATE OF CORRECTION

PATENT NO. : 6,727,550 B2
DATED : April 27, 2004
INVENTOR(S) : Tezuka et al.

It is certified that error appears in the above-identified patent and that said Letters Patent is hereby corrected as shown below:

<u>Title page,</u>
Item [57], ABSTRACT,
Line 12, change "regions is" to -- regions are --.

Signed and Sealed this

Thirtieth Day of November, 2004

JON W. DUDAS
*Director of the United States Patent and Trademark Office*